United States Patent
Zi et al.

(10) Patent No.: US 11,262,659 B2
(45) Date of Patent: Mar. 1, 2022

(54) METHOD OF CLEANING EXTREME ULTRAVIOLET LITHOGRAPHY COLLECTOR

(71) Applicant: TAIWAN SEMICONDUCTOR MANUFACTURING CO., LTD., Hsinchu (TW)

(72) Inventors: An-Ren Zi, Hsinchu (TW); Chin-Hsiang Lin, Hsinchu (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/547,317

(22) Filed: Aug. 21, 2019

(65) Prior Publication Data
US 2020/0073250 A1   Mar. 5, 2020

Related U.S. Application Data

(60) Provisional application No. 62/853,562, filed on May 28, 2019, provisional application No. 62/726,047, filed on Aug. 31, 2018.

(51) Int. Cl.
G03F 7/20 (2006.01)
G03B 27/42 (2006.01)

(52) U.S. Cl.
CPC ...... *G03F 7/70033* (2013.01); *G03F 7/70925* (2013.01)

(58) Field of Classification Search
CPC ............ G03F 7/70033; G03F 7/70925; G03F 7/70175; G03F 7/70916; G03F 7/70933; G03F 7/2004; G03F 7/2008; G03F 7/70025; G03F 7/70316; G03F 7/70908; G03F 1/52; G03F 7/70; G03F 7/70166; G03F 7/70058; G03F 7/70983; G03F 7/70191; G03F 7/70958; H05G 2/008; H05G 2/001; H05G 2/005; H05G 2/003; H05G 2/006; B82Y 10/00; B08B 3/08
See application file for complete search history.

(56) References Cited

U.S. PATENT DOCUMENTS

| 8,796,666 B1 | 8/2014 | Huang et al. |
| 9,093,530 B2 | 7/2015 | Huang et al. |
| 9,184,054 B1 | 11/2015 | Huang et al. |

(Continued)

*Primary Examiner* — Mesfin T Asfaw
(74) *Attorney, Agent, or Firm* — McDermott Will & Emery LLP

(57) ABSTRACT

A method of cleaning an extreme ultraviolet lithography collector includes applying a cleaning composition to a surface of the extreme ultraviolet lithography collector having debris on the surface of the collector in an extreme ultraviolet radiation source chamber. The cleaning composition includes: a major solvent having Hansen solubility parameters of $25>\delta_d>15$, $25>\delta_p>10$, and $30>\delta_h>6$; and an acid having an acid dissociation constant, pKa, of $-15<pKa<4$. The debris is removed from the surface of the collector and the cleaning composition is removed from the extreme ultraviolet radiation source chamber.

20 Claims, 11 Drawing Sheets

(56) References Cited

U.S. PATENT DOCUMENTS

| | | |
|---|---|---|
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2010/0025231 A1* | 2/2010 | Moriya ................ H05G 2/001 204/192.32 |
| 2011/0080567 A1* | 4/2011 | Hoekerd ............. G03F 7/70341 355/30 |
| 2013/0306110 A1* | 11/2013 | De Dea ............... G03F 7/70925 134/26 |

* cited by examiner

METHOD OF CLEANING EXTREME ULTRAVIOLET LITHOGRAPHY COLLECTOR

CROSS-REFERENCE TO RELATED APPLICATIONS

This application claims priority to U.S. Provisional Patent Application No. 62/726,047, filed Aug. 31, 2018, and U.S. Provisional Patent Application No. 62/853,562, filed May 28, 2019, the entire disclosures of each of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer. The LPP collector is subjected to damage and degradation due to the impact of particles, ions, radiation, and most seriously, tin deposition.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
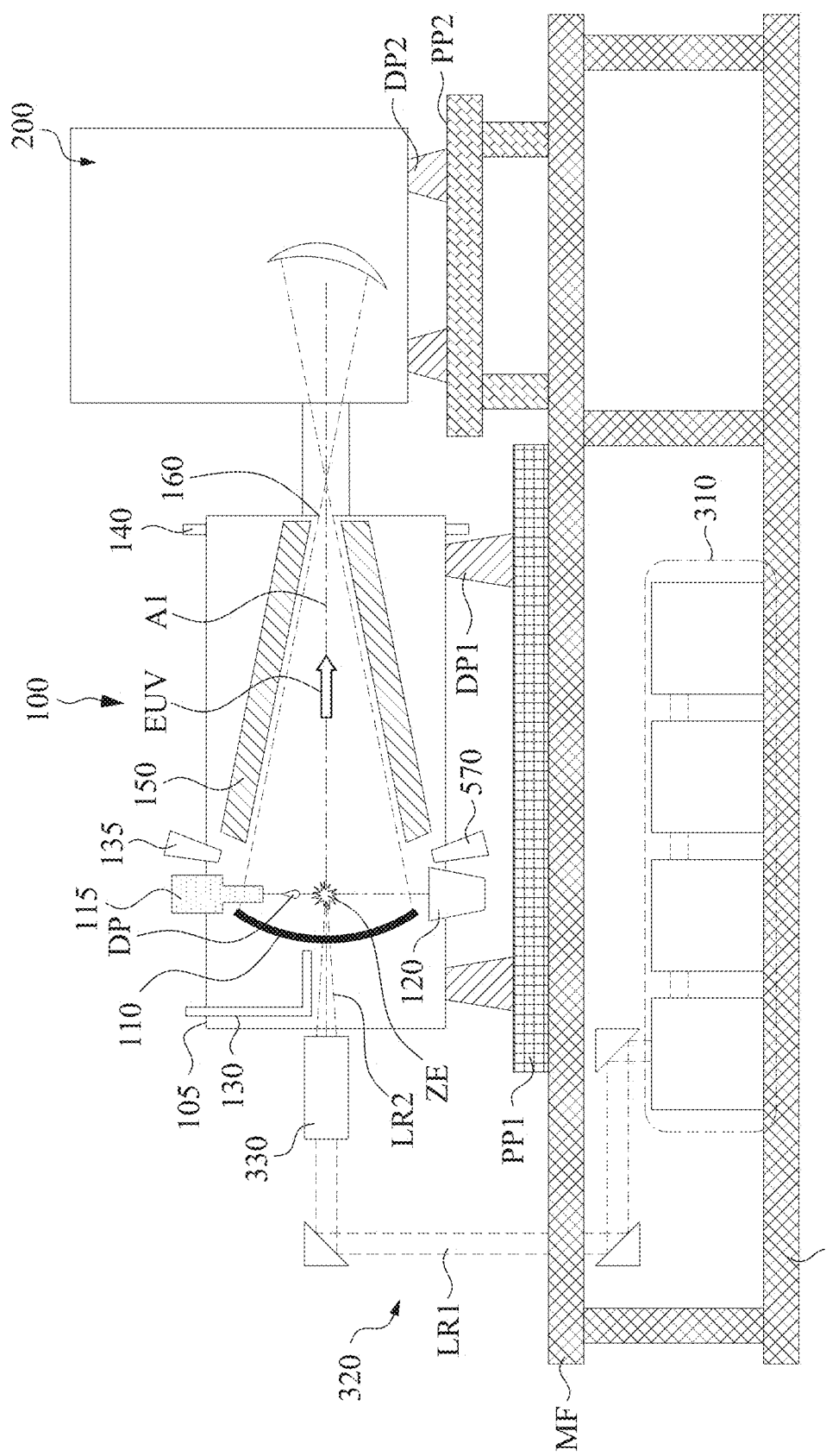
FIG. 1 is a schematic view of an EUV lithography system with a laser produced plasma (LPP) EUV radiation source, constructed in accordance with some embodiments of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is generally related to extreme ultraviolet lithography (EUVL) system and methods. More particularly, it is related to apparatuses and methods for mitigating contamination on a collector in a laser produced plasma (LPP) EUV radiation source. The collector, also referred to as an LPP collector or an EUV collector, is a component of the LPP EUV radiation source. It collects and reflects EUV radiation and contributes to overall EUV conversion efficiency. However, it is subjected to damage and degradation due to the impact of particles, ions, radiation, and debris deposition. In particular, tin (Sn) debris is one of the contamination sources of the EUV collector. EUV collector lifetime, the duration of time in which the reflectivity decays to half of itself, is one of the factors for an EUV scanner. The major reason for decay of the collector is the residual metal contamination (tin debris) on the collector surface caused by the EUV light generation procedure.

The present disclosure is directed to increasing the usable lifetime of the EUV collector. The technology of this disclosure keeps the collector in a desirable status for a longer period of time by reducing the frequency of swapping the collector. In other words, an EUV scanner will maintain the highest exposure power and throughput, and require less frequent maintenance, thereby reducing the weeklong down time required to swap the collector.

FIG. 1 is a schematic and diagrammatic view of an EUV lithography system. The EUV lithography system includes an EUV radiation source apparatus 100 to generate EUV light, an exposure tool 200, such as a scanner, and an excitation laser source apparatus 300. As shown in FIG. 1, in some embodiments, the EUV radiation source apparatus 100 and the exposure tool 200 are installed on a main floor MF of a clean room, while the excitation source apparatus 300 is installed in a base floor BF located under the main floor. Each of the EUV radiation source apparatus 100 and the exposure tool 200 are placed over pedestal plates PP1 and PP2 via dampers DP1 and DP2, respectively. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a low pressure environment to avoid EUV intensity loss.

In the present disclosure, the terms mask, photomask, and reticle are used interchangeably. In the present embodiment, the mask is a reflective mask. One exemplary structure of the mask includes a substrate made of a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by an EUV radiation source chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation laser includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200 to about 300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 further reflects and focuses the EUV radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1, in the present embodiments, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 200.

To trap the $SnH_4$ or other debris, one or more debris collection mechanisms (DCM) 150 are employed in the chamber 105.

Figure 2B:
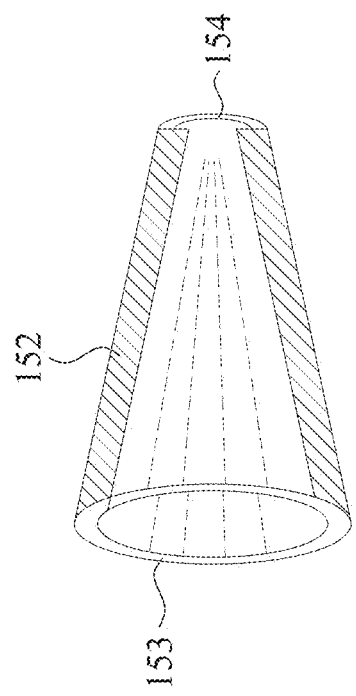
FIG. 2B is a schematic side view of a debris collection mechanism used in the EUV radiation source according to some embodiments of the present disclosure.
Figure 2A:
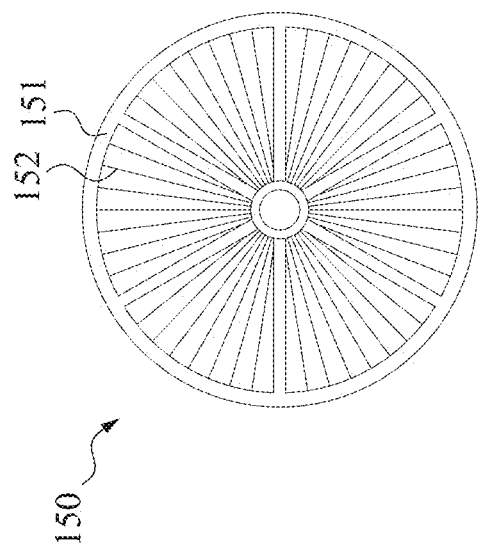
FIG. 2A is a schematic front view of a debris collection mechanism used in the EUV radiation source according to some embodiments of the present disclosure.
Figure 2C:
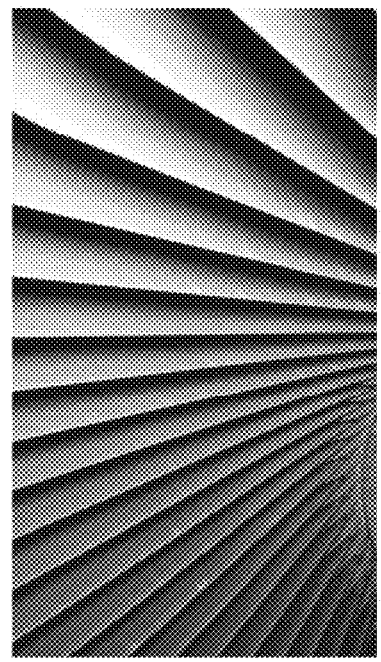
FIG. 2C is a partial picture of a vane used in the EUV radiation source according to some embodiments of the present disclosure.

As shown in FIG. 1, one or more DCMs 150 are disposed along optical axis A1 between the zone of excitation ZE and an output port 160 of the EUV radiation source 100. FIG. 2A is a front view of the DCM 150 and FIG. 2B is a schematic side view of DCM 150. FIG. 2C is a partial picture of the DCM 150. The DCM 150 includes a frustoconical support frame 151, a first end support 153 and a second end support 154 that operably support a plurality of vanes 152 that rotate within the housings. The first end support 153 has a larger diameter than the second end support 154. The DCM 150 serves to prevent the surface of collector 110 and/or other elements/portions of the inside the chamber 105 from being coated by Sn vapor by sweeping out slow Sn atoms and/or $SnH_4$ via rotating vanes 152.

The plurality of vanes 152 project radially inwardly from the frustoconical support frame 151. The vanes 152 are thin and elongate plates. In some embodiments, each of the vanes has a triangular or trapezoid or trapezium shape in plan view. The vanes 152 are aligned so that their longitudinal axes are parallel to the optical axis A1 so that they present the smallest possible cross-sectional area to the EUV radiation EUV. The vanes 152 project towards the optical axis A1, but do not extend as far as the optical axis. In some embodiments, a central core of the DCM 150 is empty. The DCM 150 is rotated by a drive unit including one or more motors, one or more belts and/or one or more gears, or any rotating mechanism. The vanes 152 are heated at 100° C. to 400° C. by a heater in some embodiments.

Figure 3:
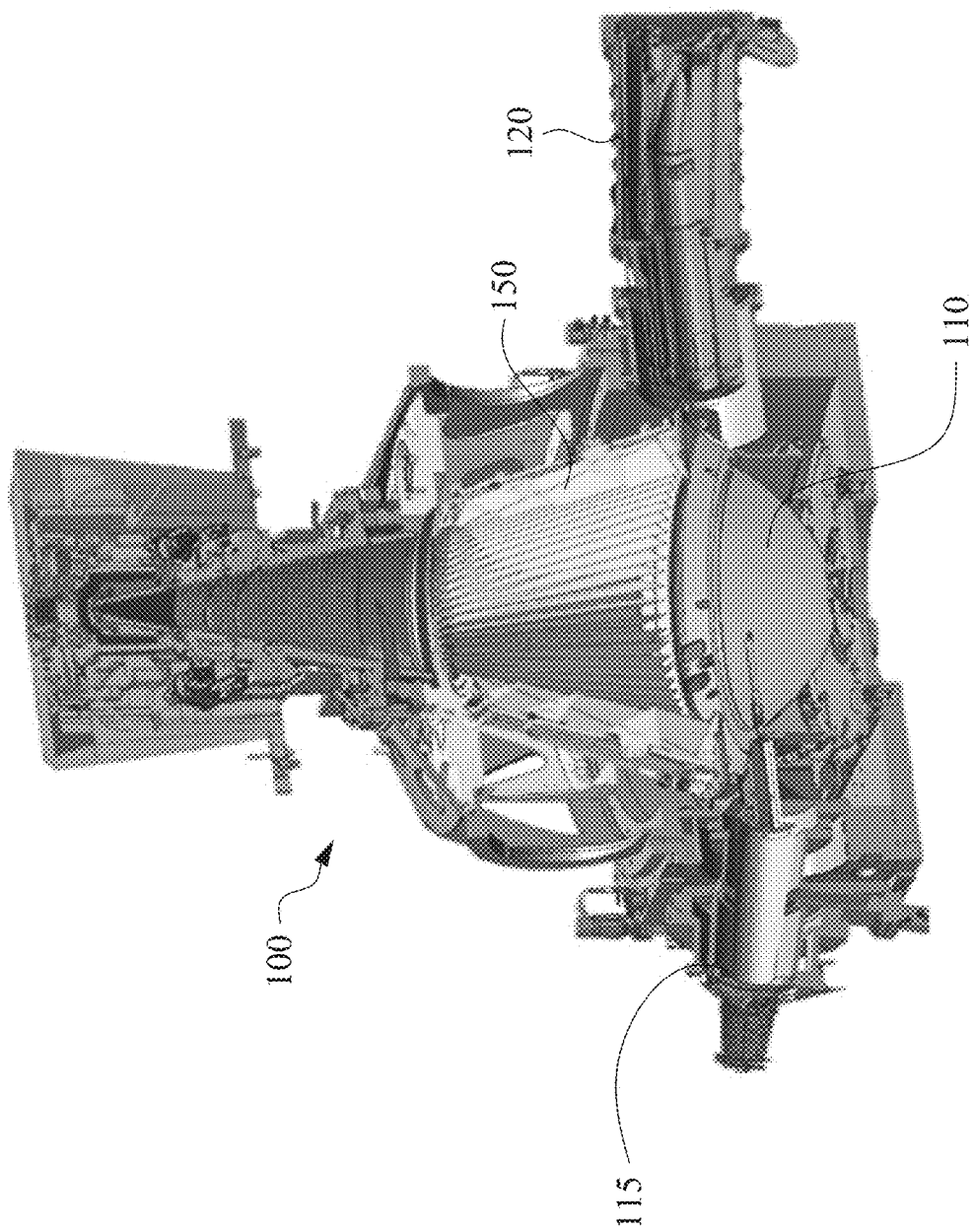
FIG. 3 shows a schematic view of the EUV radiation source 100 according to some embodiments of the disclosure.

FIG. 3 shows a schematic view of the EUV radiation source 100 including the debris collection mechanism 150, collector 110, target droplet generator 115, and droplet catcher 120.

Figure 4A:
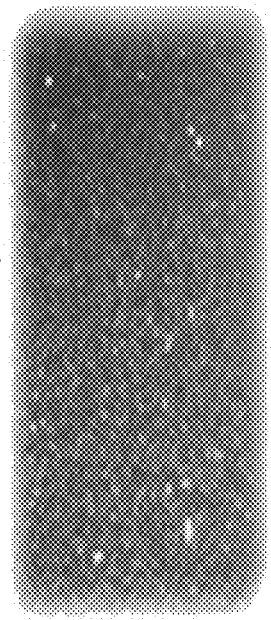
FIGS. 4A, 4B, and 4C show various surface conditions of the EUV collector with debris.
Figure 4B:
Figure 4C:
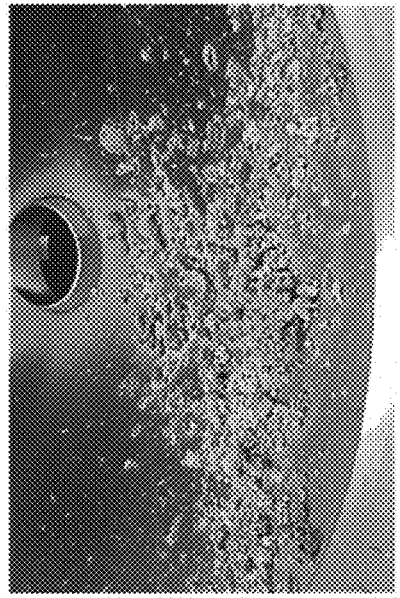

FIGS. 4A, 4B, and 4C show various surface conditions with debris. In FIG. 4A there is a substantially homogenous coating of debris on the surface of the collector 110. FIGS. 4B and 4C shows drips and drops of debris, respectively, such as drips and drops of Sn on the surface of the collector 110. Debris coating, drips, and drops degrade the efficiency of the collector, as they may block, absorb, or scatter EUV radiation. Embodiments of the disclosure clean the debris coating, drips, and drops on the surface of the collector, thereby increasing the service interval between changing the collector.

As set forth above, collector contamination due to the residual metal by EUV light generated procedure is the major cause of the EUV scanner exposure power loss and throughput down trend. The collector lifetime is about 3 months, for example, and then a week or more down time is generally necessary to swap the collector with a new collector to maintain high exposure power and throughput. EUV collectors may be changed when the reflectivity of the collector is reduced to about 50% or less of the original reflectivity in some embodiments. It would be beneficial to extend the lifetime of a collector to reduce the down time necessary to replace the collector.

Embodiments of the disclosure include a cleaning composition and methods of cleaning the collector when it becomes coated with tin and tin debris, rather than replacing the collector when Sn and Sn compounds coat the collector surface. Depending on the workload, the target droplet generator in an EUVL system may need to be refilled with tin once or twice a month. The target droplet generator refilling operation takes about 30 minutes to an hour of down time. During the refilling down time, the collector is cleaned according to embodiments of the disclosure.

Figure 5:
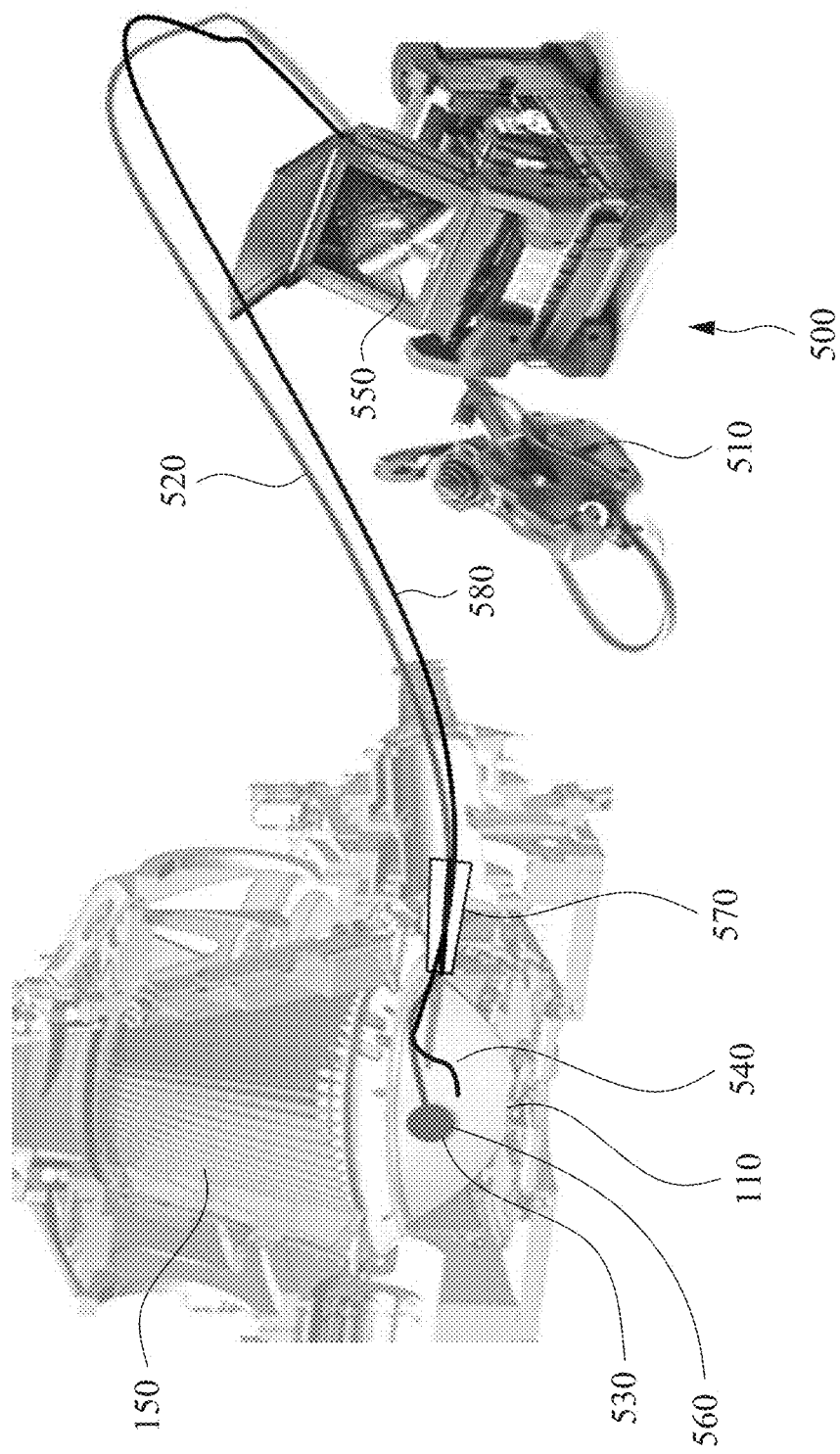
FIG. 5 illustrates an EUV cleaning operation according to an embodiment of the disclosure.

The EUV collector 110 is cleaned using an endoscope 500 in some embodiments, as shown in FIG. 5. The endoscope includes a head 510 with a flexible arm 520. The flexible arm 520 is manipulated into the collector chamber 105 of the EUV radiation source 100. In some embodiments, the flexible arm 520 is introduced into a sealable port 570 of the EUV radiation source 100 (see also FIG. 1). The flexible arm 520 moves through the sealable port 570 to access the collector chamber 105. The sealable port 570 is sealed during operation of the EUV radiation source 100. At the free end of the flexible arm 520, a cleaning cloth 530, which is impregnated with a cleaning composition 560, is attached. The cleaning composition 560 is applied to the EUV collector 110 by the cleaning cloth 530, which is manipulated by the flexible arm 520. In some embodiments, a camera 540 is attached to a separate flexible arm 580. In some embodiments, the camera 540 is also attached to same flexible arm 520 as the cleaning cloth. The camera 540 is also introduced into the collector chamber 105 through the sealable port 570. The camera 540 is separately controllable from the flexible arm 520 used to clean the collector. Therefore, the camera can be positioned at a location where it is not blocked by the cleaning cloth 530. The endoscope 500 includes a display 550 in some embodiments, so that an operator can see the EUV collector 110 during cleaning, determine when the cleaning is sufficient, and control the cleaning operation. In some embodiments, the flexible arms are manually controlled by an operator. Because the arms are flexible, the arms can be manipulated and bent so that angle between cleaning cloth and the collector surface can be changed to facilitate cleaning of the collector 110 or the camera 540 can be better positioned to observe the collector surface. By inserting the endoscope arm 520 through a sealable port 570 of the EUV radiation source chamber 105 the collector 110 can be cleaned without opening the EUV radiation source chamber 105 or removing the collector 110.

After cleaning the EUV collector with the cleaning composition, the cleaning composition and debris residue is removed from the EUV collector. The cleaning cloth 530 is removed from the EUV source chamber 105 through the sealable port 570 and is replaced by a rinsing cloth, which is impregnated with a rinsing solvent. After the rinsing cloth is attached to the endoscope arm, the rinsing cloth is introduced into the collector chamber 105 through the sealable port 570 using the flexible arm 520, and the surface of the collector is rinsed using the rinsing solvent impregnated rinsing cloth in some embodiments. The operator monitors the rinsing of the EUV collector 110, in some embodiments, using the camera 540 and the display 550.

After the rinsing operation, the remaining rinsing solvent is removed from the EUV collector surface and the EUV collector chamber. In some embodiments, the remaining rinsing solvent is removed by applying a vacuum to the EUV collector and the EUV collector chamber.

In some embodiments, the cleaning cloth and the rinsing cloth are lint-free cloths. In some embodiments, the cleaning cloth and rinsing cloth are microfiber clothes.

In some embodiments, the rinsing solvent is applied to a EUV collector by spraying rinsing solvent on the EUV collector using a nozzle and tubing attached to an external rinsing solvent source. The nozzle and tubing are introduced into the EUV radiation source chamber 105 using the endoscope arm 520 through the sealable port. After cleaning the collector 110, the cleaning cloth 530 is removed from the collector chamber 105 through the sealable port 570, and the nozzle and tubing are introduced into the collector chamber through the sealable port 570 to spray the rinsing solvent on the collector surface.

In some embodiments, the collector surface cleaning operation is performed while the target droplet generator 115 is refilled with target source material, such as tin. In some embodiments, the droplet catcher 120 is also emptied while the collector cleaning operation and refilling the target droplet generator 115 is refilled. Therefore, performing the collector surface cleaning operation does not increase the down time of the EUVL tool. In some embodiments, the cleaning operation is carried out at ambient room temperature.

In some embodiments, the composition for cleaning an extreme ultraviolet lithography collector includes a major solvent and an acid. In some embodiments, the concentration of the major solvent is from about 60 wt. % to about 99 wt. % based on the total weight of the cleaning composition. The acid concentration is from about 0.001 wt. % to about 20 wt. % based on the total weight of the cleaning composition. In certain embodiments, the acid concentration in the cleaning composition is from about 0.01 wt. % to about 15 wt. % based on the total weight of the cleaning composition.

In some embodiments, the major solvent has Hansen solubility parameters of $25>\delta_d>15$, $25>\delta_p>10$, and $30>\delta_h>6$. The units of the Hansen solubility parameters are (Joules/cm$^3$)$^{1/2}$ or, equivalently, MPa$^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other. In some embodiments, major solvents having the above Hansen solubility parameters provide cleaning compositions that provide improved, more efficient cleaning of the collector surface than cleaning compositions including solvents without the recited Hansen solubility parameters.

Solvents having the desired Hansen solubility parameters include dimethyl sulfoxide, acetone, ethylene glycol, methanol, ethanol, propanol, propanediol, water, 4-methyl-2-pentanone, hydrogen peroxide, isopropanol, butyldiglycol, and water.

In some embodiments, the acid has an acid dissociation constant, pK$_a$, of $-15<$pK$_a<4$. The acid dissociation constant, pK$_a$, is the logarithmic constant of the acid dissociation constant K$_a$. K$_a$ is a quantitative measure of the strength of an acid in solution. K$_a$ is the equilibrium constant for the dissociation of a generic acid according to the equation HA+H$_2$O$\leftrightarrow$A$^-$+H$_3$O$^+$, where HA dissociates into its conjugate base, A$^-$, and a hydrogen ion which combines with a water molecule to form a hydronium ion. The dissociation constant can be expressed as a ratio of the equilibrium concentrations:

$$K_a = \frac{[A^-][H_3O^+]}{[HA][H_2O]}.$$

In most cases, the amount of water is constant and the equation can be simplified to HA$\leftrightarrow$A$^-$+H$^+$, and $$K_a = \frac{[A^-][H^+]}{[HA]}.$$

The logarithmic constant, pK$_a$ is related to K$_a$ by the equation pK$_a=-\log_{10}$(K$_a$). The lower the value of pK$_a$ the stronger the acid. Conversely, the higher the value of pK$_a$ the stronger the base.

In some embodiments, suitable acids for the EUV collector cleaning composition include an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, and combinations thereof. In some embodiments, the acid is an inorganic acid selected from the group consisting of nitric acid, sulfuric acid, hydrochloric acid, and combinations thereof.

In some embodiments, the cleaning composition removes tin and tin-based compounds, including tin oxides from the surface of the EUV collector.

In some embodiments of the disclosure, a method of cleaning an extreme ultraviolet lithography collector includes applying a cleaning composition to a surface of the extreme ultraviolet lithography collector. The cleaning composition includes: a major solvent having Hansen solubility parameters of $25>\delta_d>15$, $25>\delta_p>10$, and $30>\delta_h>6$; and an acid having an acid dissociation constant, pKa, of $-15<pKa<4$. The cleaning composition is subsequently removed from the surface of the extreme ultraviolet lithography collector. In some embodiments, the concentration of the first solvent is from about 60 wt. % to about 99 wt. % based on the total weight of the composition. In some embodiments, the concentration of the acid is from about 0.001 wt. % to about 20 wt. % based on the total weight of the composition.

In some embodiments, the major solvent is selected from the group consisting of dimethyl sulfoxide, acetone, ethylene glycol, methanol, ethanol, propanol, propanediol, water, 4-methyl-2-pentanone, hydrogen peroxide, isopropanol, butyldiglycol, water, and combinations thereof.

In other embodiments, the cleaning composition includes a solution of HCl and $HNO_3$ in water. In some embodiments, the cleaning composition includes aqueous solutions of HCl and $HNO_3$ ranging from about 1 wt. % to about 20 wt. % HCl and from about 1.8 wt. % to about 56 wt. % $HNO_3$ in water based on the total weight of the cleaning composition. In some embodiments, the amount of $HNO_3$ ranges from about 2.8 wt. % to about 36 wt. % based on the total weight of the cleaning composition. In some embodiments, the cleaning composition includes 2 wt. % HCl+4 wt. % $HNO_3$ in water based on the total weight of the cleaning composition. In other embodiments, the cleaning composition includes 3 wt. % HCl+7 wt. % $HNO_3$ in water based on the total weight of the cleaning composition. In yet other embodiments, the cleaning composition includes 4 wt. % HCl+10 wt. % $HNO_3$ in water based on the total weight of the cleaning composition.

At acid concentrations below these ranges the cleaning may be insufficient. At acid concentrations above the upper level of these ranges, operator safety and damage to the EUV radiation light source components may become an issue. In some embodiments, the cleaning composition removes a debris coating on the collector surface at a rate of greater than 100 Å/min.

In some embodiments, the cleaning composition is removed from the surface of the extreme ultraviolet lithography collector by applying a rinsing solvent having a higher vapor pressure than the cleaning composition to the surface of collector. In some embodiments, the rinsing solvent having a higher vapor pressure than the cleaning composition is selected from the group consisting of acetone, methanol, ethanol, propanol, isopropanol, water, and combinations thereof.

In some embodiments, the method of cleaning the extreme ultraviolet collector includes applying a vacuum to the collector after the removing the cleaning composition from the surface of the extreme ultraviolet lithography collector.

Figure 6:
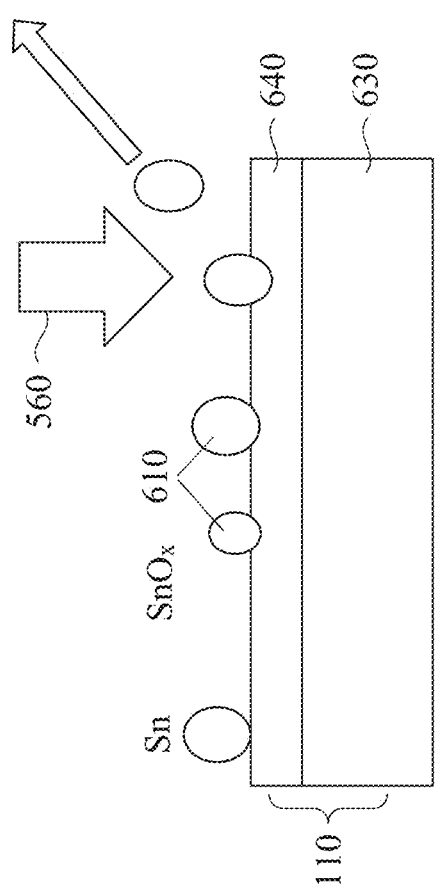
FIG. 6 illustrates the cleaning of the surface of an EUV collector according to embodiments of the disclosure.

In some embodiments, the cleaning composition 560 removes tin and tin oxide debris 610 from the surface of the collector 110, and does not remove a zirconium oxide coating 640 over the Mo/Si reflective layer 630 of the collector 110, as illustrated in FIG. 6. In some embodiments, the cleaning composition 560 reacts with tin and tin oxide, while the zirconium oxide is inert to the cleaning composition 560.

Figure 7B:
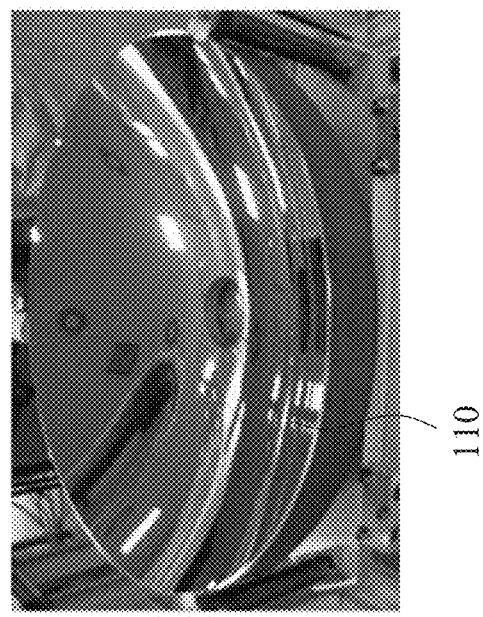
FIG. 7B shows an EUV collector after cleaning the surface thereof.
Figure 7A:
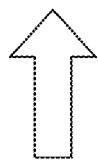
FIG. 7A shows an EUV collector after use, on which tin debris are deposited.
Figure 7A:
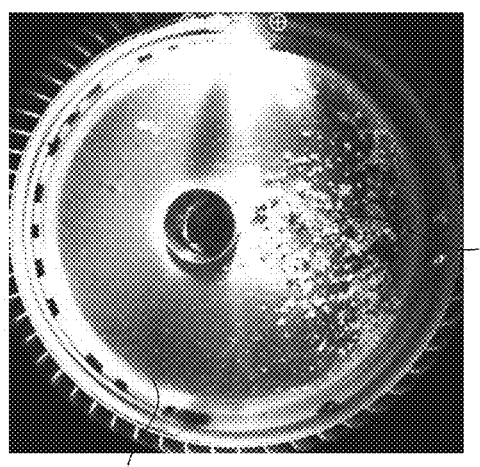

FIG. 7A shows an EUV collector 110 after use in a number of EUV lithography operations. As shown, the collector has a substantial amount of tin and tin compound debris 610 deposited on its surface. As a result, the collector has a reduced reflectivity. FIG. 7B shows an EUV collector 110 after the surface is cleaned according to an embodiment of the disclosure. As shown, the collector's surface is highly reflective after the cleaning.

In some embodiments, the reflectivity of the collector is about 10% to about 80% greater after cleaning than the reflectivity of the collector before cleaning.

Figure 8:
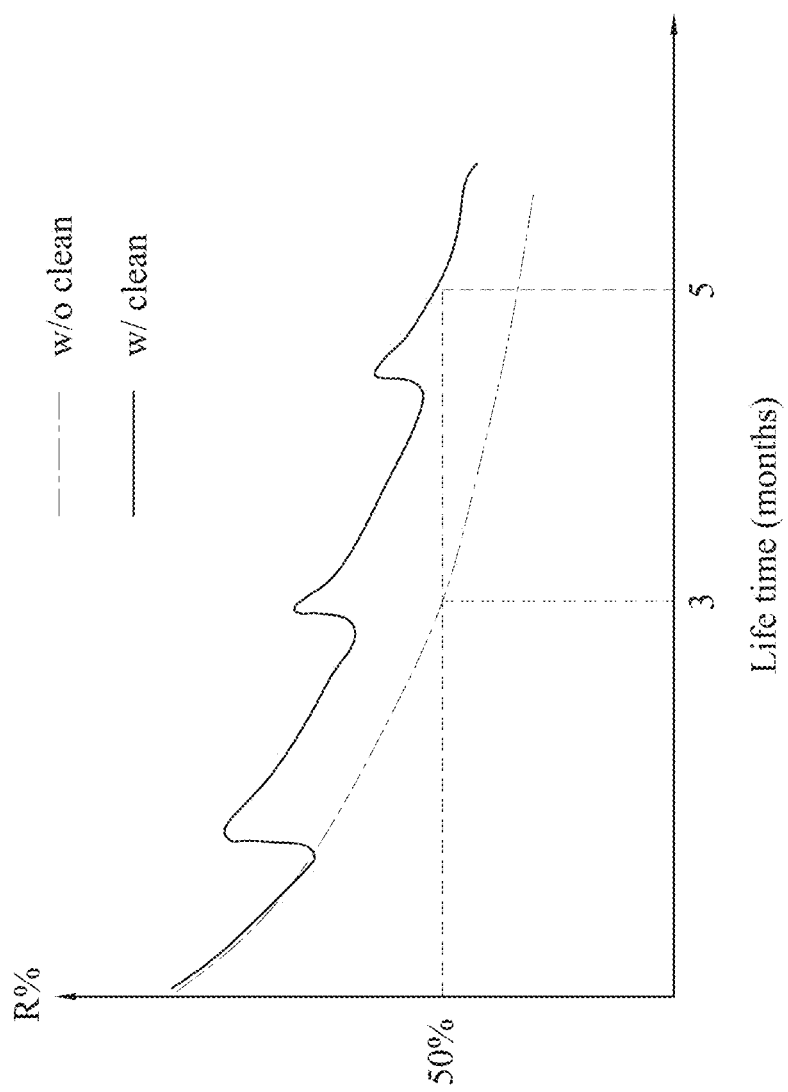
FIG. 8 shows the difference in lifetime of an EUV collector with and without cleaning according to embodiments of the disclosure.

In some embodiments, the EUV collector is replaced when the reflectivity of the collector decreases to about 50%. As shown in FIG. 8, without a cleaning operation, the life span of an EUV collector is about 3 months, depending on the work load of the EUVL tool. However, the life span of the EUV collector is extended up to about 5 months by performing the cleaning operation according to the present disclosure. Thus, the number of times the EUV collector has to be replaced, and the accompanying one week of downtime to replace the collector, is significantly reduced when the collector is cleaned according to the present disclosure. In some embodiments, the cleaning operations according to the disclosure do not totally clean the collector surface, as shown in FIG. 8. For example, in some embodiments, after a first cleaning operation, the collector reflectivity after cleaning ranges from about 80% to about 99.9% of an initial reflectivity of the collector. After a second cleaning operation, the collector reflectivity ranges from about 70% to about 99.9% of the initial collector reflectivity. After a third cleaning operation the collector reflectivity ranges from about 60% to about 99.9% of the initial collector reflectivity.

Figure 9:
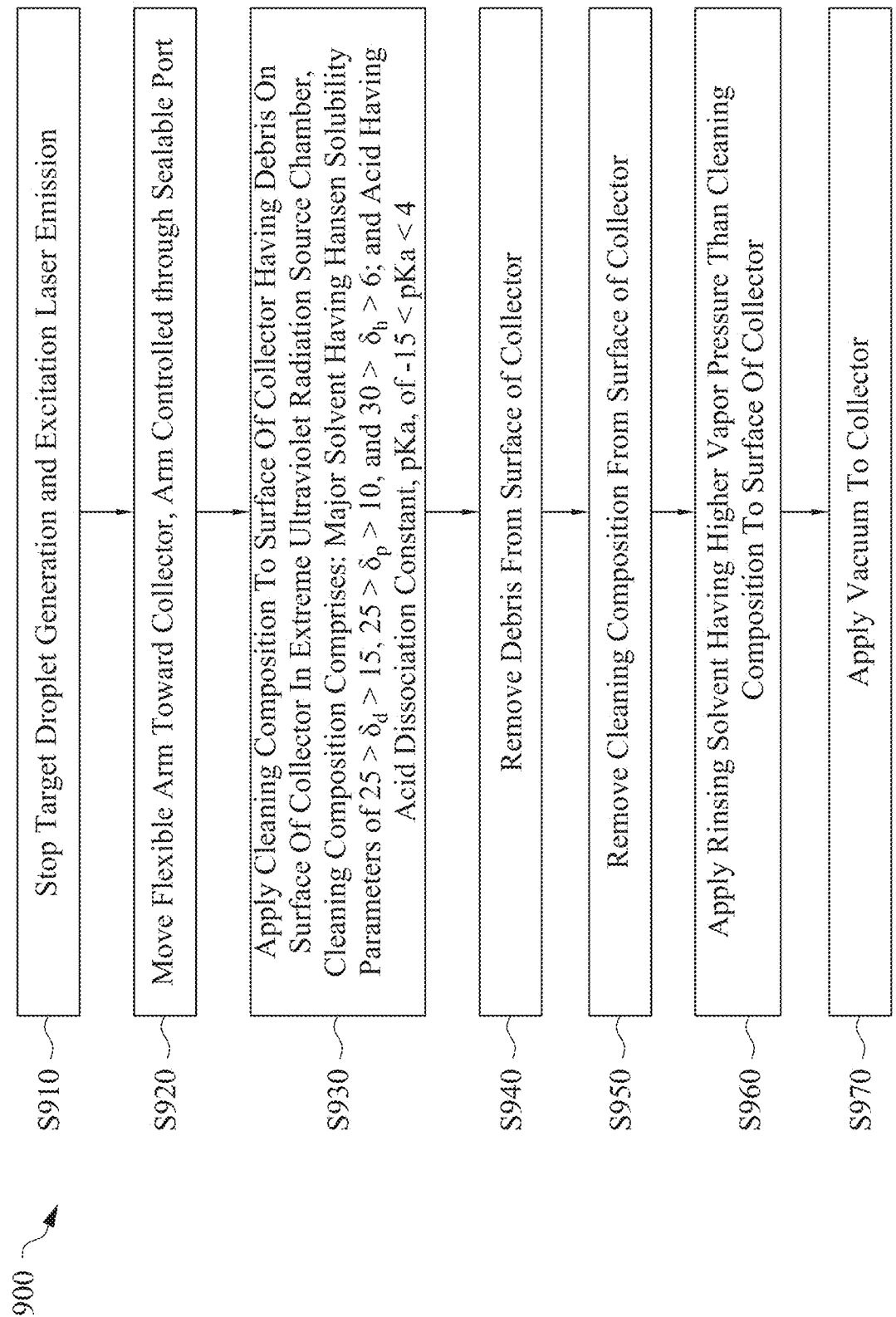
FIG. 9 is a flowchart illustrating a method of cleaning an extreme ultraviolet lithography collector.

As shown in FIG. 9, a method 900 of cleaning an extreme ultraviolet lithography collector 110 includes an operation S910 of stopping target droplet generation and excitation laser emission when it is determined the extreme ultraviolet lithography collector 110 in a EUV radiation source chamber 105 needs to have debris cleaned from its surface in some embodiments. In some embodiments, a flexible arm 520 of an endoscope 500 is moved towards the collector 110 to apply a cleaning composition to the surface of the collector 110 in operation S920. The flexible arm 520 is manipulated through a sealable port of EUV radiation source chamber 105. A cleaning composition 560 is applied to a surface of the extreme ultraviolet lithography collector 110 having debris 610 on the surface of the collector 110 in the EUV radiation source chamber 105 in operation S930 using the flexible arm 520. The cleaning composition 560 includes: a major solvent having Hansen solubility parameters of $25>\delta_d>15$, $25>\delta_p>10$, and $30>\delta_h>6$; and an acid having an acid dissociation constant, pKa, of $-15<pKa<4$. In operation S940, the debris 610 is removed from the surface of the collector 110. In some embodiments, the cleaning composition 560 reacts with the tin or tin oxide debris 610, thereby dissolving the debris in the cleaning composition. In operation 950, the cleaning composition 560 is removed from the extreme ultraviolet radiation source chamber 105 after cleaning the surface of the collector 110. In some embodiments, the cleaning composition 560 is removed from the surface of the collector 110 by applying a rinsing solvent having a higher vapor pressure than the cleaning composition 560 to the surface of collector 110 in operation S960. In some embodiments, a vacuum is applied to the collector in operation S970 after the removing the cleaning composition 560 from the surface of the collector 110. The vacuum removes the higher vapor pressure rinsing solvent in some embodiments.

Figure 10:
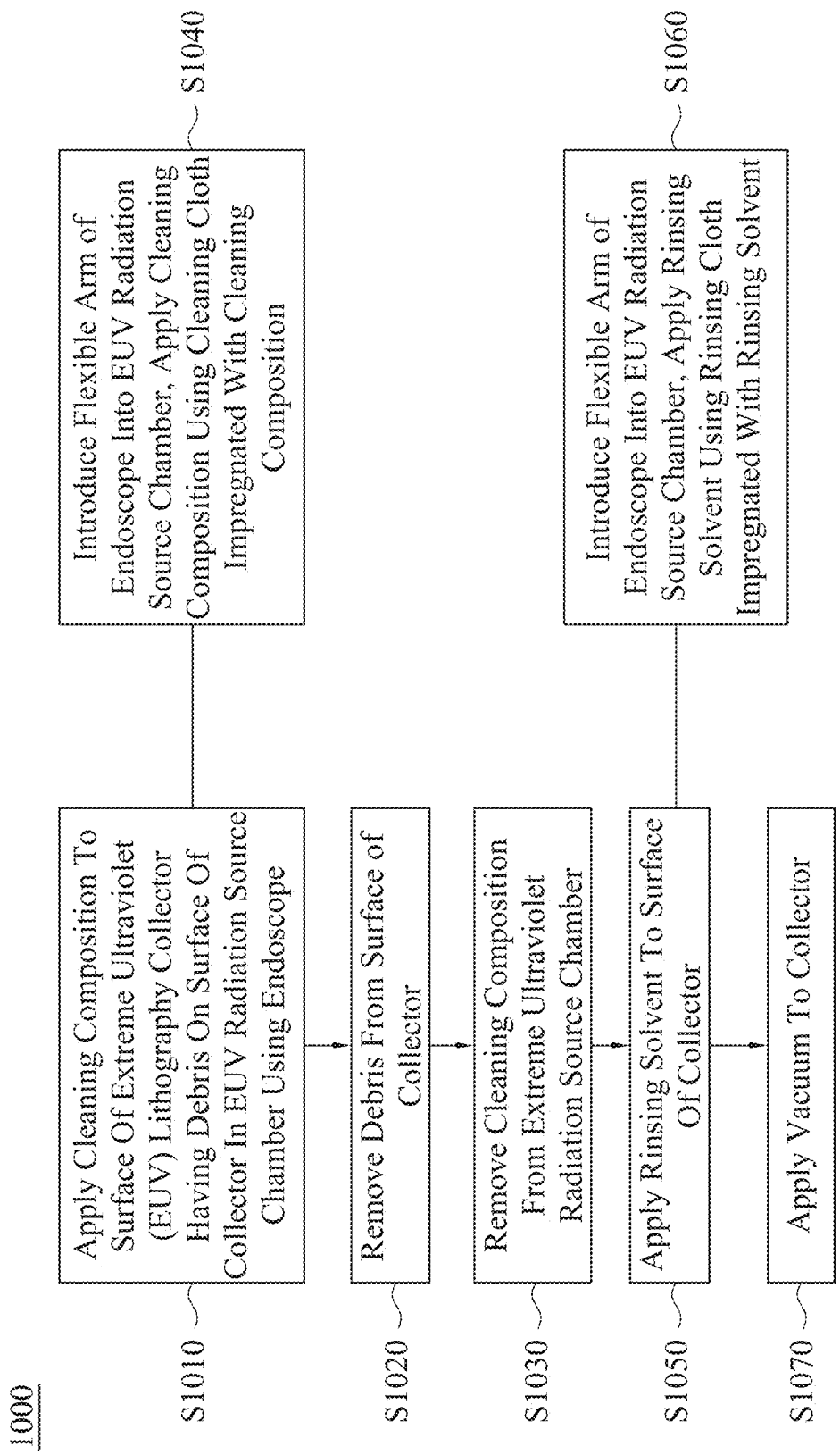
FIG. 10 is a flowchart illustrating a method of cleaning an extreme ultraviolet lithography collector.

As shown in FIG. 10, a method 1000 of cleaning an extreme ultraviolet lithography collector 110 includes an operation S1010 of applying a cleaning composition 560 to a surface of the extreme ultraviolet lithography collector 110 having debris 610 on the surface of the collector 110 in an extreme ultraviolet radiation source chamber 105. The cleaning composition 560 is applied to the surface of the collector 110 using an endoscope 500. In operation S1020, debris 610 is removed from the surface of the collector 110, and in operation S1030, the cleaning composition 560 is removed from the extreme ultraviolet radiation source chamber 105.

In some embodiments, the applying a cleaning composition 560 to a surface of the extreme ultraviolet lithography collector 110 includes introducing a flexible arm 520 of the endoscope into the extreme ultraviolet radiation source chamber 105, and the cleaning composition 560 is applied to the surface of the collector 110 using a cleaning cloth 530 impregnated with the cleaning composition 560 attached to the flexible arm 520 of the endoscope 500 in operation S1040. In some embodiments, the cleaning cloth 530 contacts the surface of the collector 110 during the cleaning operation. In some embodiments, the method 1000 includes applying a rinsing solvent to the surface of the collector after applying the cleaning composition 560 in operation S1050. In some embodiments, the applying the rinsing solvent to the surface of the extreme ultraviolet lithography collector 110 includes introducing a flexible arm 520 of the endoscope into the extreme ultraviolet radiation source chamber 105, and the rinsing solvent is applied to the surface of the collector using a rinsing cloth impregnated with the cleaning composition attached to the flexible arm 520 of the endoscope 500 in operation S1060. In some embodiments, the rinsing cloth contacts the collector surface during the rinsing operation. In some embodiments, the method 1000 includes applying a vacuum to the chamber 105 after applying the rinsing solvent to the surface of collector 110.

Figure 11:
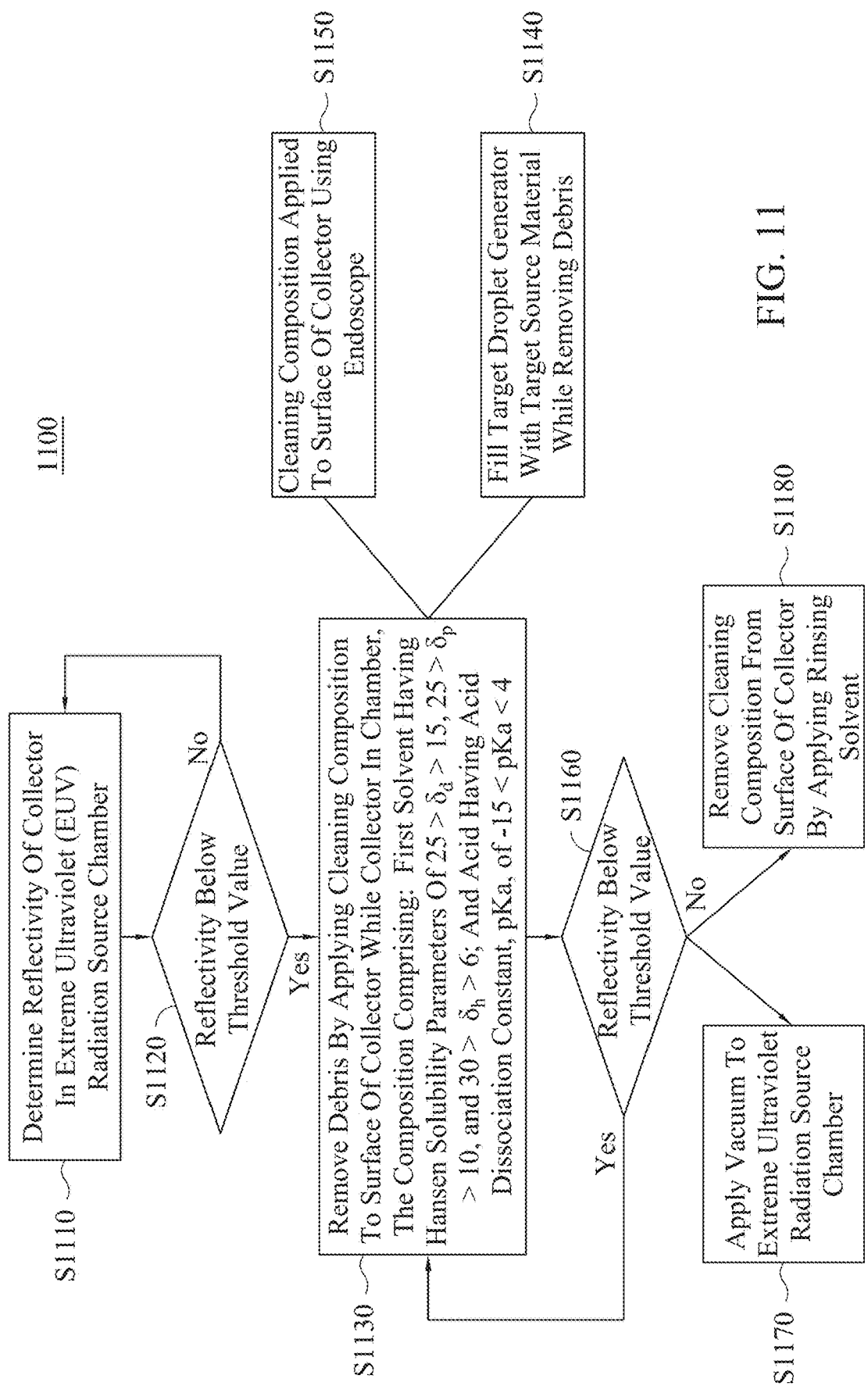
FIG. 11 is a flowchart illustrating a method of servicing an extreme ultraviolet radiation source.

As shown in FIG. 11, a method 1100 of servicing an extreme ultraviolet radiation source includes an operation 1110 of determining a reflectivity of a collector 110 in an extreme ultraviolet radiation source chamber 105. In some embodiments, the determination of reflectivity of the collector is performed using a light source, such as a laser or light emitting diode, inside the extreme ultraviolet radiation source. The light source directs a beam of light towards the collector 110; the light beam is reflected off the collector 110 and is directed to an optical sensor, which determines the percentage of the light beam that is reflected, thereby determining the reflectivity of the collector 110. If the reflectivity is above the threshold value then operation of the extreme ultraviolet radiation source continues, and monitoring of the reflectivity of the collector continues, as in operation S1120. If the reflectivity of the collector 110 is below the threshold value then debris 610 is removed from a surface of the collector 110 in operation S1130 by applying a cleaning composition 560 to a surface of a collector 110 while the collector 110 is in the chamber 105. The cleaning composition 560 includes: a first solvent having Hansen solubility parameters of $25>\delta_d>15$, $25>\delta_p>10$, and $30>\delta_h>6$; and an acid having an acid dissociation constant, pKa, of $-15<pKa<4$. A target droplet generator 115 in the extreme ultraviolet radiation source 100 is filled with target droplet source material in operation S1140 while removing the debris 610 from the surface of the collector 110. In some embodiments, the cleaning composition 560 is applied to the surface of the collector 110 using an endoscope 500 in operation S1140. In some embodiments, it is determined if the reflectivity of the collector is below the threshold value after applying the cleaning composition in operation S1160. If the reflectivity is below the threshold value in operation S1160 further cleaning of the collector surface is performed. In some embodiments, the reflectivity threshold value of the collector 110 is about 50%. In some embodiments, the collector reflectivity threshold values before and after debris removal are different. In some embodiments, the collector reflectivity threshold value after debris removal is greater than the collector reflectivity threshold value before debris removal.

In some embodiments, the method 1000 includes applying a vacuum to the extreme ultraviolet radiation source chamber 105 after removing the debris 610 and filling the target droplet generator with target source material in operation S1170.

Cleaning the collector using cleaning compositions according to the present disclosure, the life span of a collector can be significantly increased compared to the life span of a collector that does not undergo a cleaning operation. The life span of the EUV collector is extended up to about 5 months by performing the cleaning operation according to embodiments of the present disclosure. Thus, the number of times the EUV collector has to be replaced, and the accompanying one week of downtime to replace the collector, is significantly reduced when the collector is cleaned according to the present disclosure. In some embodiments of the disclosure, the collector is cleaned during other servicing of the extreme ultraviolet radiation source, such as during refilling of the target droplet generator with tin or emptying of the droplet catcher. By performing two maintenance operations at the same time, cleaning the collector and refilling the target droplet generator, EUVL tool downtime can be significantly reduced.

An embodiment of the disclosure is a method of cleaning an extreme ultraviolet lithography collector, including applying a cleaning composition to a surface of the extreme ultraviolet lithography collector having debris on the surface of the collector in an extreme ultraviolet radiation source chamber. The cleaning composition includes: a major solvent having Hansen solubility parameters of $25>\delta_d>15$, $25>\delta_p>10$, and $30>\delta_h>6$; and an acid having an acid dissociation constant, pKa, of $-15<pKa<4$. The debris is removed from the surface of the collector and the cleaning composition is removed from the extreme ultraviolet radiation source chamber. In an embodiment, the concentration of the major solvent is from 60 wt. % to 99 wt. % based on the total weight of the composition. In an embodiment, the concentration of the acid is from 0.001 wt. % to 20 wt. % based on the total weight of the composition. In an embodiment, the major solvent is selected from the group consisting of dimethyl sulfoxide, acetone, ethylene glycol, methanol, ethanol, propanol, propanediol, water, 4-methyl-2-pentanone, hydrogen peroxide, isopropanol, butyldiglycol, water, and combinations thereof. In an embodiment, the acid is an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, and combinations thereof. In an embodiment, the acid is an inorganic acid selected from the group consisting of nitric acid, sulfuric acid, hydrochloric acid, and combinations thereof. In an embodiment, the cleaning composition is removed from the surface of the extreme ultraviolet lithography collector by applying a rinsing solvent having a higher vapor pressure than the cleaning composition to the surface of collector. In an embodiment, the rinsing solvent having a higher vapor pressure than the cleaning composition is selected from the group consisting of acetone, methanol, ethanol, propanol, isopropanol, water, and combinations thereof. In an embodiment, an endoscope applies the rinse solvent to the surface of the collector. In an embodiment, the method includes applying a vacuum to the collector after the removing the cleaning composition from the surface of the extreme ultraviolet lithography collector. In an embodiment, an endoscope applies the cleaning composition to the surface of the collector. In an embodiment, the cleaning composition removes tin and tin oxides from the surface of the collector. In an embodiment, the cleaning composition does not remove a zirconium oxide coating on the collector. In an embodiment, the reflectivity of the collector is 10% to 80% greater after cleaning than the reflectivity of the collector before cleaning.

Another embodiment of the disclosure is a method of cleaning an extreme ultraviolet lithography collector, including applying a cleaning composition to a surface of the extreme ultraviolet lithography collector having debris on the surface of the collector in an extreme ultraviolet radiation source chamber. The cleaning composition is applied to the surface of the collector using an endoscope. Debris is removed from the surface of the collector and the cleaning composition is removed from the extreme ultraviolet radiation source chamber. In an embodiment, the applying a cleaning composition to a surface of the extreme ultraviolet lithography collector includes introducing a flexible arm of the endoscope into the extreme ultraviolet radiation source chamber, and the cleaning composition is applied to the surface of the collector using a cleaning cloth impregnated with the cleaning composition attached to the flexible arm of the endoscope. In an embodiment, the method includes applying a rinsing solvent to the surface of the collector after applying the cleaning composition to the surface of the collector. In an embodiment, the applying the rinsing solvent to the surface of the extreme ultraviolet lithography includes introducing a flexible arm of the endoscope into the extreme ultraviolet radiation source chamber, and the rinsing solvent is applied to the surface of the collector using a rinsing cloth impregnated with the cleaning composition attached to the flexible arm of the endoscope.

In an embodiment, the method includes applying a vacuum to the chamber after applying the rinsing solvent to the surface of collector. In an embodiment, the cleaning composition includes a major solvent having Hansen solubility parameters of $25>\delta_d>15$, $25>\delta_p>10$, and $30>\delta_h>6$; and an acid having an acid dissociation constant, pKa, of $-15<pKa<4$.

Another embodiment of the disclosure is a method of servicing an extreme ultraviolet radiation source, including determining a reflectivity of a collector in an extreme ultraviolet radiation source chamber. Debris is removed from a surface of the collector by applying a cleaning composition to a surface of a collector while the collector is in the chamber when the reflectivity of the collector is a below a threshold value. A target droplet generator in the extreme ultraviolet radiation source is filled with target droplet source material while removing the debris from the surface of the collector. The cleaning composition includes: a first solvent having Hansen solubility parameters of $25>\delta_d>15$, $25>\delta_p>10$, and $30>\delta_h>6$; and an acid having an acid dissociation constant, pKa, of $-15<pKa<4$. In an embodiment, the cleaning composition is applied to the surface of the collector using an endoscope. In an embodiment, the method includes applying a vacuum to the extreme ultraviolet radiation source chamber after removing the debris and filling the target droplet generator. In an embodiment, the cleaning composition is removed by applying a rinsing solvent to the collector. In an embodiment, the rinsing solvent is applied using a rinsing cloth impregnated with the rinsing solvent. In an embodiment, the rinsing solvent has a higher vapor pressure than the cleaning composition. In an embodiment, the vacuum is applied to the extreme ultraviolet radiation source after the applying the rinsing solvent. In an embodiment, the target droplet source material is tin. In an embodiment, the cleaning composition is applied to the collector using a cleaning cloth impregnated with the composition. In an embodiment, the threshold value of the reflectivity of the collector is 50%. In an embodiment, the debris is tin or tin compounds.

Another embodiment of the disclosure is a composition for cleaning an extreme ultraviolet lithography collector, including a major solvent having Hansen solubility parameters of $25>\delta_d>15$, $25>\delta_p>10$, and $30>\delta_h>6$, and an acid having an acid dissociation constant, pKa, of $-15<pKa<4$. In an embodiment, the concentration of the major solvent is from 60 wt. % to 99 wt. % based on the total weight of the composition. In an embodiment, the concentration of the acid is from 0.001 wt. % to 20 wt. % based on the total weight of the composition. In an embodiment, the major solvent is selected from the group consisting of dimethyl sulfoxide, acetone, ethylene glycol, methanol, ethanol, propanol, propanediol, water, 4-methyl-2-pentanone, hydrogen peroxide, isopropanol, butyldiglycol, and combinations thereof. In an embodiment, the acid is an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-1-sulfonic acid, 5-sulfosalicylic acid, and combinations thereof. In an embodiment, the acid is an inorganic acid selected from the group consisting of nitric acid, sulfuric acid, hydrochloric acid, and combinations thereof.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning an extreme ultraviolet lithography collector, comprising:
    applying by a flexible arm, while the extreme ultraviolet lithography collector is in an extreme ultraviolet radiation source chamber, a cleaning composition to a surface of the extreme ultraviolet lithography collector having debris on the surface of the collector,
    wherein the cleaning composition comprises: a major solvent having Hansen solubility parameters of $25>\delta_d>15$, $25>\delta_p>10$, and $30>\delta_h>6$; and an acid having an acid dissociation constant, pKa, of $-15<pKa<4$;
    removing the debris from the surface of the collector; and
    removing the cleaning composition from the extreme ultraviolet radiation source chamber,
    wherein the flexible arm has a free end, the cleaning composition is applied to the surface of the extreme ultraviolet lithography collector by using a cleaning cloth impregnated with the cleaning composition, and the cleaning cloth is attached to the free end of the flexible arm.

2. The method according to claim 1, wherein the concentration of the major solvent is from 60 wt. % to 99 wt. % based on the total weight of the composition.

3. The method according to claim 1, wherein the concentration of the acid is from 0.001 wt. % to 20 wt. % based on the total weight of the composition.

4. The method according to claim 1, wherein the major solvent is selected from the group consisting of dimethyl sulfoxide, acetone, ethylene glycol, methanol, ethanol, propanol, propanediol, water, 4-methyl-2-pentanone, hydrogen peroxide, isopropanol, butyldiglycol, water, and combinations thereof.

5. The method according to claim 1, wherein the acid is an organic acid selected from the group consisting of ethanedioic acid, methanoic acid, 2-hydroxypropanoic acid, 2-hydroxybutanedioic acid, citric acid, uric acid, trifluoromethanesulfonic acid, benzenesulfonic acid, ethanesulfonic acid, methanesulfonic acid, oxalic acid, maleic acid, carbonic acid, oxoethanoic acid, 2-hydroxyethanoic acid, propanedioic acid, butanedioic acid, 3-oxobutanoic acid, hydroxylamine-o-sulfonic acid, formamidinesulfinic acid, methylsulfamic acid, sulfoacetic acid, 1,1,2,2-tetrafluoroethanesulfonic acid, 1,3-propanedisulfonic acid, nonafluorobutane-l-sulfonic acid, 5-sulfosalicylic acid, and combinations thereof.

6. The method according to claim 1, wherein the acid is an inorganic acid selected from the group consisting of nitric acid, sulfuric acid, hydrochloric acid, and combinations thereof.

7. The method according to claim 1, wherein the cleaning composition is removed from the surface of the extreme ultraviolet lithography collector by applying a rinsing solvent having a higher vapor pressure than the cleaning composition to the surface of collector.

8. The method according to claim 7, wherein the rinsing solvent having a higher vapor pressure than the cleaning composition is selected from the group consisting of acetone, methanol, ethanol, propanol, isopropanol, water, and combinations thereof.

9. The method according to claim 1, further comprising applying a vacuum to the collector after the removing the cleaning composition from the surface of the extreme ultraviolet lithography collector.

10. The method according to claim 1, wherein the cleaning composition removes tin and tin oxides from the surface of the collector.

11. The method according to claim 1, wherein the cleaning composition does not remove a zirconium oxide coating on the collector.

12. A method of cleaning an extreme ultraviolet lithography collector, comprising:
    applying, while the extreme ultraviolet lithography collector is in an extreme ultraviolet radiation source chamber, a cleaning composition to a surface of the extreme ultraviolet lithography collector having debris on the surface of the collector,
    wherein the cleaning composition is applied to the surface of the collector using an endo scope;
    removing the debris from the surface of the collector; and
    removing the cleaning composition from the extreme ultraviolet radiation source chamber,
    wherein the endoscope has a flexible arm with a free end, the cleaning composition is applied to the surface of the collector using a cleaning cloth impregnated with the cleaning composition, and the cleaning cloth is attached to the free end of the flexible arm of the endo scope.

13. The method according to claim 12, further comprising applying a rinsing solvent to the surface of the collector after applying the cleaning composition to the surface of the collector.

14. The method according to claim 13, wherein the applying the rinsing solvent to a surface of the extreme ultraviolet lithography collector comprises:
    applying the rinsing solvent to the surface of the collector using a rinsing cloth impregnated with the rinsing solvent attached to the free end of the flexible arm of the endoscope.

15. The method according to claim 13, further comprising applying a vacuum to the chamber after applying the rinsing solvent to the surface of the collector.

16. The method according to claim 12, wherein the cleaning composition comprises: a major solvent having Hansen solubility parameters of $25>\delta_d>15$, $25>\delta_p>10$, and $30>\delta_h>6$; and an acid having an acid dissociation constant, pKa, of $-15<pKa<4$.

17. The method according to claim 12, wherein the flexible arm is introduced into the extreme ultraviolet radiation source chamber through a sealable port disposed on the extreme ultraviolet radiation source chamber.

18. A method of servicing an extreme ultraviolet radiation source, comprising:
    determining a reflectivity of a collector in an extreme ultraviolet radiation source chamber;
    removing debris from a surface of the collector by applying, by a flexible arm, a cleaning composition to a surface of a collector while the collector is in the chamber when the reflectivity of the collector is a below a threshold value; and filling a target droplet generator in the extreme ultraviolet radiation source with target droplet source material while removing the debris from the surface of the collector, wherein the cleaning composition comprises:

a first solvent having Hansen solubility parameters of $25 > \delta_d > 15$, $25 > \delta_p > 10$, and $30 > \delta_h > 6$; and an acid having an acid dissociation constant, pKa, of $-15 < pKa < 4$, wherein the flexible arm has a free end, the cleaning composition is applied to the surface of the collector by using a cleaning cloth impregnated with the cleaning composition, and the cleaning cloth is attached to the free end of the flexible arm.

19. The method according to claim 18, further comprising applying a vacuum to the extreme ultraviolet radiation source chamber after removing the debris and filling the target droplet generator.

20. The method according to claim 18, wherein the flexible arm is introduced into the extreme ultraviolet radiation source chamber through a sealable port disposed on the extreme ultraviolet radiation source chamber.

* * * * *